United States Patent
Selzer et al.

(10) Patent No.: US 6,845,145 B2
(45) Date of Patent: Jan. 18, 2005

(54) METHOD OF IMPROVING X-RAY LITHOGRAPHY IN THE SUB 100NM RANGE TO CREATE HIGH QUALITY SEMICONDUCTOR DEVICES

(75) Inventors: Robert Allen Selzer, Waterbury, VT (US); Franz Ludwig Rauch, Waterbury, VT (US); Heinz Siegert, Williston, VT (US); Klaus Simon, Madison, WI (US); William Rudolf Friml, New Haven, VT (US); Joe Baker Gagnon, Waterbury Cntr, VT (US); Robert Harrison Macklin, Richmond, VT (US)

(73) Assignee: SAL, Inc., S. Burlington, VT (US)

( * ) Notice: Subject to any disclaimer, the term of this patent is extended or adjusted under 35 U.S.C. 154(b) by 0 days.

(21) Appl. No.: 09/876,443

(22) Filed: Jun. 7, 2001

(65) Prior Publication Data

US 2001/0026606 A1 Oct. 4, 2001

Related U.S. Application Data

(62) Division of application No. 09/332,206, filed on Jun. 12, 1999, now Pat. No. 6,295,332.

(51) Int. Cl.⁷ ............................................. G21K 5/00
(52) U.S. Cl. ........................... 378/34; 378/35; 378/147
(58) Field of Search ........................ 378/34, 35, 147, 378/205, 207, 210; 340/870.31

(56) References Cited

U.S. PATENT DOCUMENTS

| | | | | |
|---|---|---|---|---|
| 5,001,039 A | * | 3/1991 | Ogoh | 430/311 |
| 5,157,700 A | * | 10/1992 | Kurosawa et al. | 378/34 |
| 5,222,112 A | * | 6/1993 | Terasawa et al. | 378/84 |
| 5,333,166 A | * | 7/1994 | Seligson et al. | 378/34 |
| 5,333,167 A | * | 7/1994 | Iizuka et al. | 378/35 |
| 5,497,147 A | * | 3/1996 | Arms et al. | 340/870.35 |
| 5,524,131 A | * | 6/1996 | Uzawa et al. | 378/34 |
| 5,666,189 A | * | 9/1997 | Rostoker et al. | 355/53 |
| 5,953,106 A | * | 9/1999 | Unno et al. | 355/55 |
| 6,038,013 A | * | 3/2000 | Ohsaki | 355/53 |
| 6,038,279 A | * | 3/2000 | Miyake et al. | 378/34 |
| 6,144,719 A | * | 11/2000 | Hasegawa et al. | 378/34 |
| 6,188,513 B1 | * | 2/2001 | Hudyma et al. | 359/366 |

\* cited by examiner

Primary Examiner—Craig E. Church
Assistant Examiner—Irakli Kiknadze
(74) Attorney, Agent, or Firm—Thomas N. Neiman; James Marc Leas

(57) ABSTRACT

The present invention is directed to the production of high quality semi-conductor devices created at speeds and in sizes that far exceed current x-ray lithography capabilities. The steps involved in the method include the use and development of horizontal beams from a synchrotron or point source of x-ray beams; preparation of submicrometer, transverse horizontal and vertical stepper stages and frames; providing a stepper base frame for the proper housing and mating of the x-ray beam; minimizing the effects of temperature and airflow control by means of a environmental chamber; transporting, handling and prealigning wafers and other similar items for tight process control; improving the control and sensing of positional accuracy through the use of differential variable reluctance transducers; controlling the continuous gap and all six degrees of freedom of the wafer being treated with a multiple variable stage control; incorporating alignment systems using unambiguous targets to provide data to align one level to the next level; beam transport, shaping or shaping devices, to include x-ray point sources; using an inline collimator or concentrator for collimating or concentrating the x-ray beams; and, imaging the mask pattern at the precise moment for optimum effectiveness.

36 Claims, 2 Drawing Sheets

ND OF IMPROVING X-RAY
LITHOGRAPHY IN THE SUB 100NM RANGE
TO CREATE HIGH QUALITY
SEMICONDUCTOR DEVICES

Divisional of prior application Ser. No. 09/332,206 filed Jun. 12, 1999, now U.S. Pat. No. 6,915,332.

BACKGROUND OF THE INVENTION

This invention pertains to a method of conducting x-ray lithography and in particular, to the method of improving x-ray lithography in the sub 100 nm range to create high quality semiconductor devices for use in the manufacturing of commercial and military semiconductor devices used in phased array radar, missile seeking devices direct broadcast satellite television receivers, wide band wireless systems, global positioning satellite receivers and cellular telephones, and other equipment.

Current systems on the market today use x-ray or optical lithography to transfer a pattern from a mask to a wafer in a parallel method. The pattern is transferred from mask to wafer much faster than the serial writing of e-beam. The benefits of x-ray lithography range from a factor of 5 to about a factor of 600. Mix and match is the key to cost effective production, where most of the levels are defined by optical lithography and the critical levels are patterned using x-ray lithography. The benefits of using x-ray lithography for critical levels provide the means to ramp up production of semiconductor devices to meet not only defense requirements, but the emerging commercial requirements as well. What is needed is a new generation x-ray lithography stepper designed specifically to be integrated to an x-ray point source with an x-ray point source with the eventual addition of a collimator to further resolve features below 100 nm. It is also necessary to automate wafer and mask handling.

Clearly, it is desirable for this method to be very adaptable. At the same time, the method should be cost effective. It is the object of this invention to set forth a method of improving x-ray lithography in the sub 100 nm range to create high quality semiconductor devices which avoid the disadvantages, previously mentioned limitations of typical methods of production of current semiconductor devices.

SUMMARY OF THE INVENTION

Particularly, it is the object of this invention to teach a method of improving x-ray lithography in the sub 100 nm range to create high quality semiconductor devices, for use in the manufacturing of commercial and military semiconductor devices used in a phased array radar, missile seeking devices, direct broadcast satellite television receivers, wide band wireless systems, global positioning satellite receivers and cellular telephones, and other equipment, said method comprising the steps of providing the use and development of horizontal beams from a synchrotron or point source of x-ray beams; preparing of submicrometer, transverse horizontal and vertical stepper stages and frames; providing a stepper base frame for the proper housing and mating of the x-ray beam; minimizing the effects of temperature and airflow control by means of an environmental chamber; transporting, handling and prealigning wafers and other items for tight process control; improving the control and sensing of positional accuracy through the use of differential variable reluctance transducers; controlling the continuous gap and all six degrees of freedom of the wafer being treated with a multiple variable stage control; incorporating alignment systems using unambiguous targets to provide data to align one level to the next level; using beam transport, shaping or shaping devices to include x-ray point sources; using an inline collimator or concentrator for collimating or concentrating the x-ray beams; and imaging the pattern at the precise moment for optimum effectiveness.

BRIEF DESCRIPTION OF THE INVENTION

Further objects and features of this invention will become more apparent by reference to the following description taken in conjunction with the following figures, in which.

DESCRIPTION OF THE PREFERRED EMBODIMENTS

Figure 1:
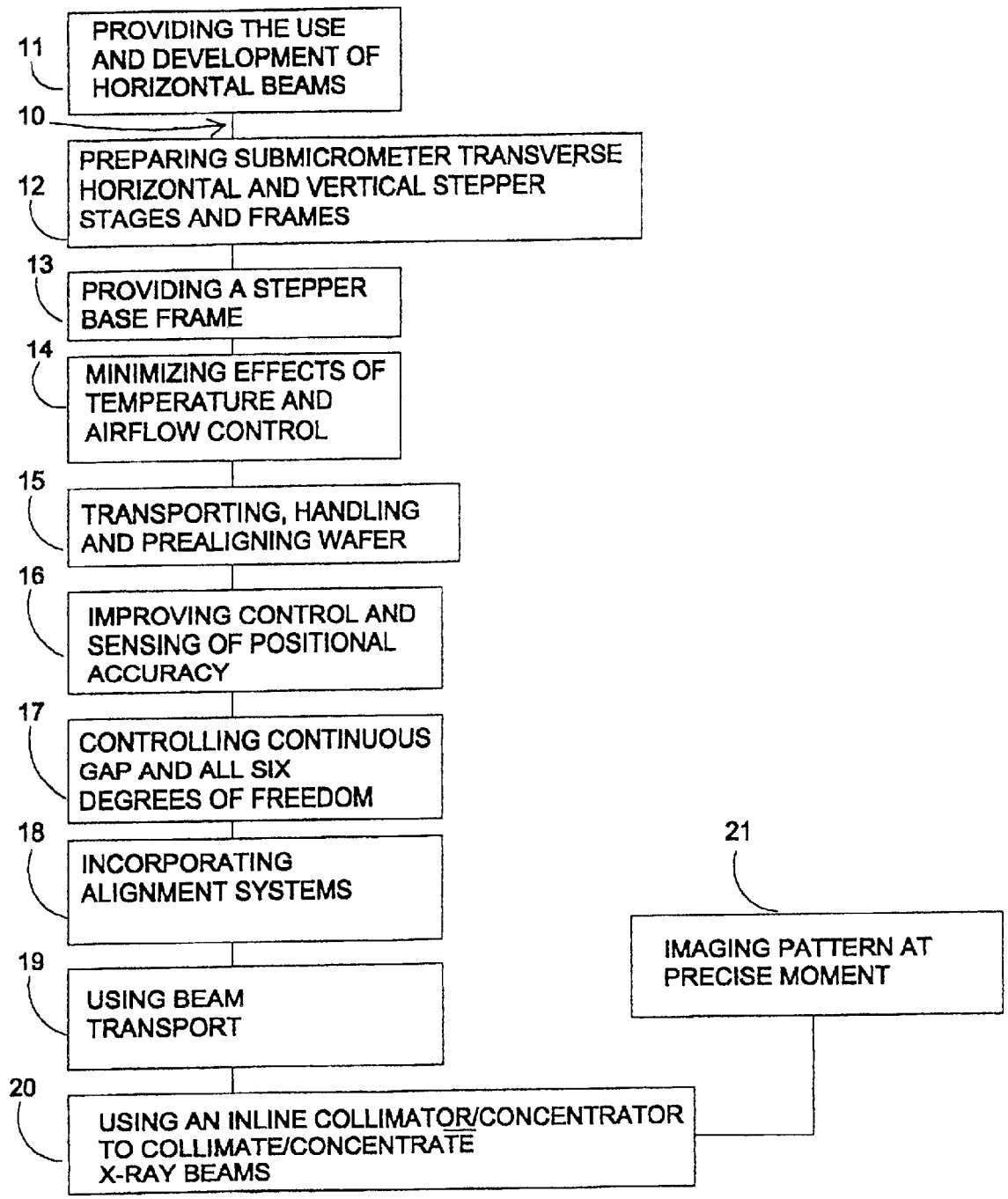
FIG. 1 is a block diagram of the novel method of improving x-ray lithography in the sub 100 nm range to create high quality semiconductor devices.

As shown in FIG. 1, the novel method 10 of improving x-ray lithography in the sub 100 nm range to create high quality semiconductor devices comprises the steps of providing for the use and development horizontal beams from a synchrotron or point source of x-ray beams 11. The preparation of submicrometer, transverse horizontal and vertical stepper stages and frames 12 is next. This step develops stages and frames comprised of light weight, honeycomb structure constructed of composite materials. Also, used in this step includes using air or gaseous bearings, vacuum clamping and mating surfaces, active weight compensation; linear actuators and a fine alignment flexure stage for a all six degrees of freedom. The third step provides a stepper base frame for the proper housing and mating of the x-ray beam 13. Techniques and equipment used in this step include beam alignment, vibration insulation used when connecting to a stationary x-ray synchrotron or point source.

The forth step is minimizing the effects of temperature and airflow by means of an environmental chamber 14. This unit is designed to control the temperature and humidity and, at the same time, minimize particle and molecular contamination. The fifth step is designed to transport, handle and prealign wafers and other similar items for tight process control 15. This step is required to produce high quality semiconductors. All critical wafer and mask handling and treating processes should be operated in a cluster like environment—the processes include coating, pre-baking, aligning and exposure, post baking and quality control. The sixth step is improving the control and sensing of positional accuracy through the use of differential variable reluctance transducers 16. The differential variable reluctance transducer provide a positional feedback for the six degrees of freedom alignment stage.

The next step controls the continuous gap and all six degrees of freedom of the wafer being treated with a multiple variable stage control 17. The step uses an advanced multiple variable stage control that is designed as a cross coupled gantry in order to optimize the precise alignment of the device levels. Alignment systems are then incorporated using unambiguous targets in order to align one level to the next level 18. The alignment systems consist of multiple bright fields optical microscopes, normal to the plane of imaging to provide axis x, y and z, magnification and rotational data in order to align one level with the next level. Also, an additional imaging broad band interferometer alignment system is used to provide precise alignment of wafer levels and gap control during the x-ray exposure. The following step in the process is to use beam transport shaping or shaping devices to include x-ray point sources 19. This step uses steppers to interface an x-ray source mechanical interface and a vacuum or helium tight quick coupling. A beam transport chamber is used, either a snout design small unit or a large design integrated into the stepper base frame or as a full chamber designed for helium and or other low attenuation at atmosphere or lower pressure.

The next step 20 uses an in line collimator or concentrator for collimating or concentrating the x-ray beams, along with the use of shutter and x-ray pulse controls. Mask magnification control is provided to allow for a mix and match with optical lithography levels and techniques. Finally, in the last step 21, the process images the pattern at the precise moment for optimum effectiveness. The whole process is repeated again to image the entire wafer or substrate with the mask pattern. The wafer or substrate is removed as in step number 15 and then repeated again and again until all wafers or substrates are imaged.

Figure 2:
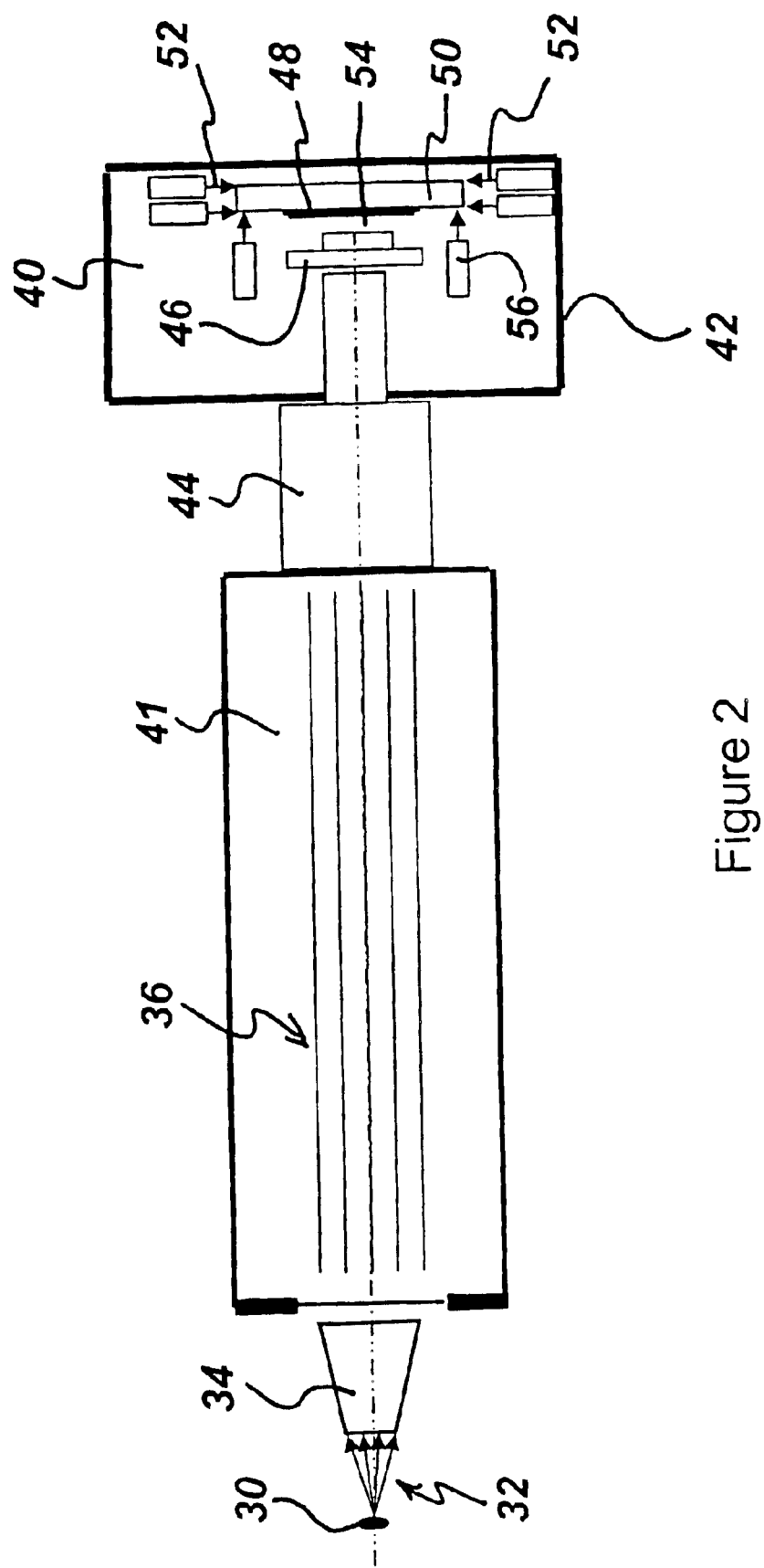
FIG. 2 is a diagram of the apparatus used in the present invention.

The apparatus used in operation of the invention is illustrated in FIG. 2. Point source 30 provides x-ray beams 32. In-line collimator or concentrator 34 provides collimated or concentrated x-ray beam 36 for transport in beam transport chamber 38, which minimizes effects of temperature and airflow as beam 36 travels to stepper 40. A vacuum may be provided in beam transport chamber 38. Alternatively, helium 41 and or other low attenuation gas at atmosphere or lower pressure can be used in beam transport chamber 38.

Stepper 40 has a stepper base frame 42. Vibration insulation 44 is provided when connecting stepper base frame 42 to point source 30 for proper housing and mating of x-ray beam 32, 36.

Mask 46 includes a pattern for transfer to wafer 48 on stage 50. Differential variable reluctance transducers 52 provide positional information of stage 50. Gap 54 and six degrees of freedom alignment are provided by multiple variable stage control 56.

While we have described our invention in connection with specific embodiments thereof, it is clearly to be understood that this is done only by way of example and not as a limitation to the scope of our invention as set forth in the objects thereof and in the appended claims.

What is claimed is:

1. A method of exposing a resist on a substrate comprising the steps of:
   a) providing the substrate with a film of resist;
   b) placing the substrate on stage; and
   c) sensing the position of the substrate with a displacement sensor, wherein said displacement sensor comprises a differential variable reluctance transducer (DVRT); and
   d) providing a source of radiation, and exposing said resist with said radiation.

2. The method as recited in claim 1, wherein the substrate comprises a wafer.

3. The method as recited in claim 2, wherein said wafer comprises a semiconductor.

4. The method as recited in claim 1, wherein said radiation has a wavelength to provide a structure having a dimension less than 100 nm.

5. The method as recited in claim 4, wherein said radiation comprises x-ray radiation.

6. The method as recited in claim 5, further comprising the step of collimating said x-ray radiation.

7. The method as recited in claim 5, further comprising the step of concentrating said x-ray radiation.

8. The method as recited in claim 1, further comprising the step of providing a mask for defining exposure of said resist.

9. The method as recited in claim 8, wherein said mask is spaced from said substrate by a gap, said method further comprising the step of moving said to stage to adjust said gap.

10. The method as recited in claim 8, further comprising the step of using output of said displacement sensor to control said exposing step.

11. The method as recited in claim 10, wherein said mask is positioned with respect to said substrate, said method further comprising the step of exposing said resist at a time when said displacement sensor output indicates that position of said mask with respect to said substrate is optimum.

12. The method as recited in claim 11, wherein said mask is spaced from said substrate by a gap, said method further comprising the step of exposing said resist at a time when said displacement sensor output indicates that said gap is optimum.

13. The method as recited in claim 8, further comprising the step of using said displacement sensor output to control mask to wafer misalignment.

14. The method as recited in claim 1, further comprising the step of using said displacement sensor output to control substrate x, y, z, rotation, and magnification.

15. A system for exposing a substrate comprising a stepper and an X ray source, vibration insulation there between.

16. A method of exposing a resist on a substrate comprising the steps of:
   a) providing the substrate with a film of resist;
   b) placing the substrate on a stage;
   c) providing x-ray radiation from a point source;
   d) using an inline collimator to collimate said x-ray radiation;
   e) providing a mask for defining exposure of said resist;
   f) illuminating said mask with said x-ray radiation after said collimating step (d); and
   g) exposing said resist with x-ray radiation passing through said mask;
   h) sensing position of the substrate with a displacement sensor wherein displacement sensor comprises a differential variable reluctance transducer (DVRT).

17. The method as recited in claim 16, wherein said x-ray radiation has a wavelength to provide a structure having a dimension less than 100 nm.

18. The method as recited in claim 16, wherein the substrate comprises a wafer.

19. The method as recited in claim 18, wherein said wafer comprises a semiconductor.

20. The method as recited in claim 16, wherein said mask is spaced from said substrate by a gap, said method further comprising the step of moving said stage to adjust said gap.

21. The method as recited in claim 16, further comprising the step of using output of said displacement sensor to control said exposing step.

22. The method as recited in claim 21, wherein said mask is positioned with respect to said substrate, said method further comprising the step of exposing said resist at a time when said displacement sensor output indicates that position of said mask with respect to said substrate is optimum.

23. The method as recited in claim 21, wherein said mask is spaced from said substrate by a gap, said method further comprising the step of exposing said resist at a time when said displacement sensor output indicates that said gap is optimum.

24. The method as recited in claim 16, further comprising the step of using displacement sensor output to control mask to wafer misalignment.

25. The method as recited in claim 16, further comprising the step of using displacement sensor output to control substrate x, y, z, rotation, and magnification.

26. The method as recited in claim 16, wherein said x-ray radiation passes through a beam transport chamber having helium or other low attenuation gas or helium and another low attenuation gas at atmospheric pressure or at lower pressure.

27. A method of exposing a resist on a substrate comprising the steps of:
   a) providing the substrate with a film of resist;
   b) placing the substrate on a stage;
   c) providing x-ray radiation from a point source;
   d) collimating said x-ray radiation;
   e) providing a mask for defining exposure of said resist;
   f) illuminating said mask with said x-ray radiation after said collimating step (d);
   g) exposing said resist with x-ray radiation passing through said mask; and
   h) sensing position of the substrate with a displacement sensor wherein said displacement sensor comprises a differential variable reluctance transducer (DVRT).

28. The method as recited in claim 27, further comprising the step of using output of said DVRT to control said exposing step.

29. The method as recited in claim 28, wherein said mask is positioned with respect to said substrate, said method further comprising the step of exposing said resist at a time when said output of said DVRT indicates that position of said mask with respect to said substrate is optimum.

30. The method as recited in claim 28, wherein said mask is spaced from said substrate by a gap, said method further comprising the step of exposing said resist at a time when said output of said DVRT indicates that said gap is optimum.

31. The method as recited in claim 27, further comprising the step of using output of said DVRT to control mask to wafer misalignment.

32. The method as recited in claim 27, further comprising the step of using output of said DVRT to control substrate x, y, z, rotation, and magnification.

33. The method as recited in claim 27, further comprising the step of using output of said DVRT to provide positional feedback for six degrees of freedom alignment of the substrate.

34. The method as recited in claim 33, further comprising the step of controlling all six degrees of freedom of the substrate.

35. A method of exposing a resist on a substrate comprising the steps of:
   a) providing the substrate with a film of resist;
   b) placing the substrate on a stage;
   c) providing x-ray radiation from a point source;
   d) using an inline concentrator to concentrate said x-ray radiation;
   e) providing a mask for defining exposure of said resist;
   f) illuminating said mask with said x-ray radiation after said concentrating step (d); and
   g) exposing said resist with x-ray radiation passing through said mask;
   h) sensing position of the substrate with a displacement sensor wherein displacement sensor comprises a differential variable reluctance transducer (DVRT).

36. A method of exposing a resist on a substrate comprising the steps of:
   a) providing the substrate with a film of resist;
   b) placing the substrate on a stage;
   c) providing x-ray radiation from a point source;
   d) concentrating said x-ray radiation;
   e) providing a mask for defining exposure of said resist;
   f) illuminating said mask with said x-ray radiation after said concentrating step (d);
   g) exposing said resist with x-ray radiation passing through said mask; and
   h) sensing position of the substrate with a displacement sensor wherein said displacement sensor comprises a differential variable reluctance transducer (DVRT).

* * * * *